(12) United States Patent
Kim et al.

(10) Patent No.: US 10,593,731 B2
(45) Date of Patent: Mar. 17, 2020

(54) DISPLAY DEVICE HAVING BACK SUPPORT STRUCTURE

(71) Applicant: LG Display Co., Ltd., Seoul (KR)

(72) Inventors: Donghoon Kim, Seoul (KR);
Choonghyoun Choi, Paju-si (KR);
Hwanseong Park, Ulsan (KR)

(73) Assignee: LG Display Co., Ltd., Seoul (KR)

( * ) Notice: Subject to any disclaimer, the term of this patent is extended or adjusted under 35 U.S.C. 154(b) by 85 days.

(21) Appl. No.: 15/608,171

(22) Filed: May 30, 2017

(65) Prior Publication Data
US 2017/0345874 A1   Nov. 30, 2017

(30) Foreign Application Priority Data

May 30, 2016  (KR) .......................... 10-2016-0066448

(51) Int. Cl.
| | | |
|---|---|---|
| *H01L 29/08* | (2006.01) | |
| *H01L 27/32* | (2006.01) | |
| *B22C 7/02* | (2006.01) | |
| *B22C 7/06* | (2006.01) | |
| *H01L 23/40* | (2006.01) | |

(Continued)

(52) U.S. Cl.
CPC .............. *H01L 27/32* (2013.01); *B22C 7/026* (2013.01); *B22C 7/065* (2013.01); *H01L 23/40* (2013.01); *H01L 51/529* (2013.01); *H04B 1/3877* (2013.01); *H01L 27/3244* (2013.01);
(Continued)

(58) Field of Classification Search
USPC ......................................................... 257/40
See application file for complete search history.

(56) References Cited

U.S. PATENT DOCUMENTS

2014/0063412 A1*  3/2014 Zhou ................... G02B 6/0088
  349/65
2014/0286049 A1*  9/2014 Cha ................... G02F 1/133615
  362/609
(Continued)

FOREIGN PATENT DOCUMENTS

| CN | 101738785 A | 6/2010 |
| CN | 102748674 A | 10/2012 |
| KR | 2013-0073231 A | 7/2013 |

OTHER PUBLICATIONS

Office Action with English translation dated Oct. 9, 2018 issued in the corresponding Chinese Patent Application No. 20170387588.4, pp. 1-21.

*Primary Examiner* — Caleb E Henry
(74) *Attorney, Agent, or Firm* — Polsinelli PC

(57) ABSTRACT

The present disclosure relates to a display device. A downward-bending portion is formed on an end of an inner plate arranged on the inner surface of a back cover, which is a back support structure of the display device, such that the outer surface of the downward-bending portion contacts the inner surface of the back cover, thereby improving the rigidity and heat-radiating performance of the inner plate, and guaranteeing that the elastic force from the downward-bending portion prevents the display panel from being damaged by cracks. Furthermore, an inward-bending portion is formed on the front end of the vertical extension portion of the back cover, thereby improving the rigidity of the back cover, and guaranteeing that elastic deformation of the inward-bending portion protects the display device from lateral impacts.

20 Claims, 14 Drawing Sheets

(51) Int. Cl.
    *H01L 51/52*    (2006.01)
    *H04B 1/3877*   (2015.01)
(52) U.S. Cl.
    CPC ................ *H01L 2023/4087* (2013.01); *H01L 2251/5307* (2013.01)

(56) References Cited

U.S. PATENT DOCUMENTS

2016/0271914 A1* 9/2016 Xie ................ B32B 27/302
2018/0074363 A1* 3/2018 Matsumoto ....... G02F 1/133308

* cited by examiner

DISPLAY DEVICE HAVING BACK SUPPORT STRUCTURE

CROSS REFERENCE TO RELATED APPLICATION

This application claims priority from Korean Patent Application No. 10-2016-0066448, filed on May 30, 2016, which is hereby incorporated by reference in its entirety for all purposes as if fully set forth herein.

BACKGROUND

Field of the Disclosure

The present disclosure relates to a display device and, more particularly, to a display device. Although the present disclosure is suitable for a wide scope of applications, it is particularly suitable for improving rigidity and heat-dissipation performance of the back support structure of the display device by forming a bending portion at an end of at least one of a back cover of the display device.

Description of the Background

With the development of various portable electronic devices, such as a mobile communication terminal and a notebook computer, the requirement for a flat-panel display device applicable thereto is increasing.

The flat-panel display devices that are being researched include a liquid crystal display (LCD) device, a plasma display panel (PDP), a field emission display (FED) device, a light emitting diode (LED) display device, and an organic light emitting diode (OLED) display device.

Among these display devices, the liquid crystal display (LCD) device includes: an array substrate including a thin-film transistor; an upper substrate including a color filter and/or a black matrix, etc.; and a liquid crystal layer formed therebetween, wherein an alignment state of the liquid crystal layer is adjusted according to an electric field applied between opposite electrodes of a pixel area, and thereby adjusting the transmittance of light to display an image.

In a display panel of such a liquid crystal display device, an active area (AA), configured to provide an image to a user, and a non-active area (NA), which is a peripheral area of the active area (AA), are defined. The display panel is usually manufactured by attaching a first substrate, which is an array substrate having a thin-film transistor formed thereon to define a pixel area, and a second substrate, which is an upper substrate having a black matrix and/or a color filter layer formed thereon, to each other.

The array substrate or the first substrate, on which a thin-film transistor is formed, includes a plurality of gate lines GS extending in a first direction and a plurality of data lines DL extending in a second direction perpendicular to the first direction and one pixel area P is defined by each gate line and each data line. One or more thin-film transistors are formed in one pixel area P, and a gate or source electrode of each thin-film transistor may be connected to a gate line and a data line, respectively.

Among such flat-panel display devices, the liquid crystal display device does not have its own light-emitting element and thus needs a separate light source. Therefore, a backlight unit having a light source, such as an LED, is arranged on the back surface of the liquid crystal display device so as to emit light toward the front surface of the liquid crystal panel, thereby ultimately implementing a recognizable image.

Meanwhile, an organic light-emitting Diode (OLED) display device has recently come into the spotlight as a display device and has advantages of a fast response rate, a high light-emission efficiency, a high luminance, and a wide viewing angle owing to the use of an OLED that emits light by itself.

Such an organic light-emitting display device uses a self-light-emitting element and thus requires no backlight of the type used for a liquid crystal device that uses a non-light-emitting element, thereby making it possible to realize a lightweight and compact display device. Moreover, the organic light-emitting display device is superior to the liquid crystal display device in terms of the viewing angle and a contrast ratio, and is also advantageous in terms of power consumption. In addition, the organic light-emitting display device can be driven by a low DC voltage, has a fast response rate, is strongly resistant to external impacts due to internal elements made of solid materials, has a wide temperature range in which the same can be used, and particularly has the advantage of low manufacturing costs.

Such an organic light-emitting device displays images in a type such as a top-emission type or a bottom-emission type depending on the structure of the organic light-emitting element including a first electrode, a second electrode, and an organic light-emitting layer. In the bottom-emission type, visible light generated by the organic light-emitting layer is displayed toward the bottom of the substrate on which transistors are formed, while, in the top-emission type, visible light emitted by the organic light-emitting layer is displayed toward the top of the substrate on which transistors are formed.

In the case of the organic light-emitting display device, sub-pixels including organic light-emitting diodes are arranged in a matrix form, and the brightness of sub-pixels selected by a scan signal is controlled according to a grayscale value of data. Further, the organic light-emitting diode display device is a self-light-emitting element, consumes less power, and has a high response rate, a high light-emission efficiency, a high luminance, and a wide viewing angle.

Meanwhile, a final product including such a display device is a set device, examples of which include a TV, a computer monitor, an advertisement board, and the like.

Such a display device or a set device includes a support structure that supports a liquid crystal or organic light-emitting display panel from behind, and such a support structure needs to exhibit at least a predetermined level of secured rigidity because the same needs to form the exterior of the display device and to protect the display panel, and also needs to have a function of discharging heat generated from the display panel or the control circuit to the outside.

Meanwhile, a normal organic light-emitting display device may employ a back cover for supporting the back surface of the organic light-emitting display panel and an inner plate attached to the inner surface of the back cover so as to reinforce the rigidity of the back cover and to have a heat-dissipation function.

However, such a conventional structure employing a back cover and an inner plate has problems in that the back cover or the inner plate has a large thickness in order to secure the rigidity of the display device, and heat dissipation through the inner plate is insufficient.

Accordingly, the present disclosure seek to provide schemes for increasing the rigidity of the support structure of the display device and improving the heat-dissipation characteristics through the support structure by changing the structure of the back cover and the inner plate.

SUMMARY OF THE DISCLOSURE

The present disclosure has been made to solve the above-mentioned problems occurring in the prior art, and an aspect of the present disclosure is to provide a display device having improved rigidity and heat-dissipating characteristics by changing the structure of the back cover and the inner plate, which are support structures that constitute the display device.

Another aspect of the present disclosure is to provide a display device having an inward-bending portion formed at the front end of a vertical extension portion of the back cover, which is a back support structure of the display device, such that not only is the rigidity of the back cover improved, but elastic deformation of the inward-bending portion prevents damage due to lateral impacts.

Another aspect of the present disclosure is to provide a display device having a downward-bending portion formed on an end of the inner plate arranged on the inner surface of the back cover, which is a back support structure of the display device, such that the outer surface of the downward-bending portion contacts the inner surface of the back cover, thereby improving the rigidity and heat-radiating performance of the inner plate and guaranteeing that elastic force from the downward-bending portion prevents the display from being cracked.

Another aspect of the present disclosure is to provide a display device structured to have an inward-bending portion formed at the front end of a vertical extension portion of the back cover, which is a back support structure, and to have a downward-bending portion formed at an end of the inner plate, which is arranged on the inner surface of the back cover, thereby increasing the overall rigidity of the display device support structure, and efficiently dissipating the heat generated from the display device.

A display device according to the present aspect may include: a display panel; a back cover including a horizontal portion that supports a rear side of the display panel and a vertical extension portion extending vertically from an end of the horizontal portion so as to cover a side surface of the display panel; and an inner plate including a horizontal portion attached to an inner surface of the horizontal portion of the back cover through an adhesive member and a downward-bending portion bent downward from a periphery of the horizontal portion so as to contact the inner surface of the horizontal portion of the back cover.

A display device according to another aspect of the present disclosure may include a display panel having a rear side and a plurality of lateral sides; a back cover comprising a first horizontal portion, a first vertical portion and a first bending portion, wherein the first horizontal portion supports the rear side of the display panel and the first vertical extension portion is vertically extended from an end of the first horizontal portion to cover the lateral sides of the display panel, and the first ending portion is extended from the first vertical portion; and an inner plate comprising a second horizontal portion and a second bending portion wherein the second horizontal portion is attached to an inner surface of the first horizontal portion and the second bending portion bent downward extended from a periphery of the second horizontal portion to contact the inner surface of the first horizontal portion.

In addition to the above configuration, furthermore, an inward-bending portion may be additionally arranged on an end of the vertical extension portion of the back cover so as to be bent toward the side surface of the display panel. A first gap for elastic deformation of the inward-bending portion may be provided between the vertical extension portion of the back cover and the inward-bending portion, and a second gap for elastic deformation of the downward-bending portion may be provided between the horizontal portion of the inner plate and the downward-bending portion.

In addition, the downward-bending portion of the inner plate may have a double-folded structure including a primary folded portion that is primarily folded upward from the horizontal portion of the inner plate and a secondary folded portion that is folded downward from an end of the primary folded portion.

The display panel may be an organic light-emitting display panel including a light-emitting layer including a substrate, multiple thin-film transistors formed on the substrate, and an organic light-emitting element layer that emits light between two electrode layers arranged on one side of the thin-film transistors, and an encapsulation layer arranged on one side of the light-emitting layer. Specifically, the organic light-emitting display panel may be of a bottom-emission type such that light from the organic light-emitting element layer is discharged through the substrate.

When a surface through which light from the organic light-emitting display panel is discharged is defined as an image display surface, the light-emitting layer and the encapsulation layer may be successively laminated beneath the image display surface, the light-emitting layer may have the substrate, the thin-film transistors, and the organic light-emitting element layer successively arranged beneath the image display surface, and a polarizing layer may be additionally arranged on the upper portion of the substrate.

In addition, the organic light-emitting element layer may be a white organic light-emitting element layer that emits white light, and the light-emitting layer may further include a color filter layer arranged on the white organic light-emitting element layer.

Aspects of the present disclosure, as described above, are advantageous in that the rigidity and heat-radiating characteristics of the display device support structure are improved by changing the structure of the back cover and the inner plate, which are support structures that constitute the display device.

More specifically, an inward-bending portion is formed on the front end of a vertical extension portion of the back cover, which is a back support structure of the display device, such that not only is the rigidity of the back cover improved, but elastic deformation of the inward-bending portion protects the display device from lateral impacts.

In addition, a downward-bending portion is formed on an end of the inner plate arranged on the inner surface of the back cover, which is a back support structure of the display device, such that the outer surface of the downward-bending portion contacts the inner surface of the back cover, thereby improving the rigidity and heat-radiating performance of the inner plate and guaranteeing that elastic force from the downward-bending portion prevents the display panel from being cracked.

It is to be understood that both the foregoing general description and the following detailed description are exemplary and explanatory and are intended to provide further explanation of the present disclosure as claimed.

BRIEF DESCRIPTION OF THE DRAWINGS

The accompanying drawings, which are included to provide a further understanding of the disclosure and are incorporated in and constitute a part of this application, illustrate aspect(s) of the disclosure and together with the description serve to explain the principle of the disclosure.

In the drawings.

DETAILED DESCRIPTION

Figure 1:
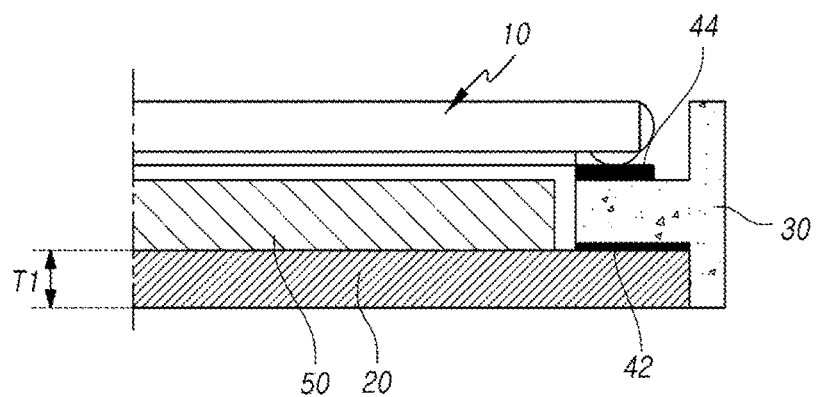
FIG. 1 illustrates a display device support structure according to the related art.

Hereinafter, some aspects of the present disclosure will be described in detail with reference to the accompanying illustrative drawings. In designating elements of the drawings by reference numerals, the same elements will be designated by the same reference numerals although they are shown in different drawings. Further, in the following description of the present disclosure, a detailed description of known functions and configurations incorporated herein will be omitted when it may make the subject matter of the present disclosure rather unclear.

In addition, terms, such as first, second, A, B, (a), (b) or the like may be used herein when describing components of the present disclosure. Each of these terminologies is not used to define an essence, order or sequence of a corresponding component but used merely to distinguish the corresponding component from other component(s). In the case that it is described that a certain structural element "is connected to", "is coupled to", or "is in contact with" another structural element, it should be interpreted that another structural element may "be connected to", "be coupled to", or "be in contact with" the structural elements as well as that the certain structural element is directly connected to or is in direct contact with another structural element.

Figure 2:
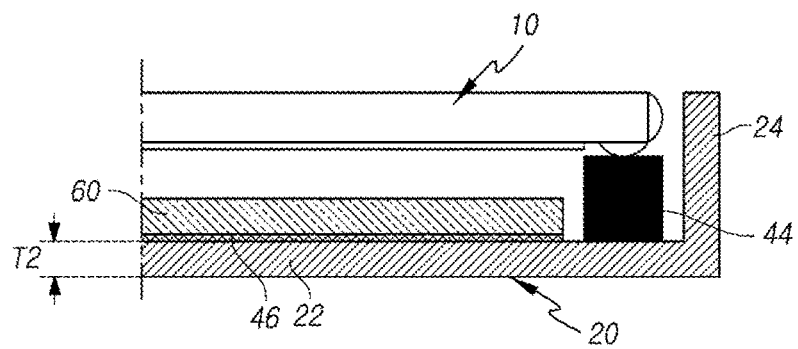
FIG. 2 illustrates another display device support structure according to the related art.

FIG. 1 illustrates a display device support structure according to the related art, and FIG. 2 illustrates another display device support structure according to the related art.

The display device according to the related art illustrated in FIG. 1 includes a display panel 10 and a back cover 20 and a middle cabinet 30 as support structures that support the display panel 10.

In of FIG. 1, the back cover 20 may be made of an advanced composite material (ACM) having a thickness of about 2.5 mm or larger such that a rigidity for the back cover 20 can be secured.

As used herein, the advanced composite material (ACM) is a high-performance composite material obtained by combining a carbon fiber, a silicon carbide fiber, an aramid fiber, a boron fiber, or the like and a heat-resistive resin such as epoxy resin or polyimide.

When a back cover made of such ACM material is used, the material characteristics make it impossible to mold an end by folding the same, and it thus becomes necessary to use a middle cabinet 30 that is coupled to the back cover 20, constitutes the side exterior of the display device, and protects the side surface of the display panel 10.

Specifically, a middle cabinet 30 having a T-shaped section is coupled to the back cover through an adhesive member 42, such as a piece of double-sided tape, in the end area of the flat panel-type back cover 20, and a display panel 10 is attached and fixed on the horizontal support portion of the middle cabinet 30.

In the case of the structure of FIG. 1, furthermore, it is also possible to use a pad 50 made of a magnetic or non-magnetic material on the inner surface of the back cover 20, and such a magnetic pad 50 has the function of filling the space between the back cover 20 and the display panel 10.

In this regard, the middle cabinet 30 has a quadrangular frame-shaped structure with a sectional shape including multiple folded portions, and may be denoted by another expression such as a guide panel, a plastic chassis, a p-chassis, a support main, a main support, or a mold frame.

The middle cabinet 30 is made of a synthetic resin mold material such as polycarbonate, or a metal material such as aluminum, and is fabricated through an injection molding type.

Such a display device support structure as illustrated in FIG. 1 has a problem in that the characteristics of the ACM material make it difficult to conduct a forming process for implementing accurate dimensions, and has a disadvantage in that the back cover has a relatively large thickness T1 in order to secure a sufficient back cover rigidity.

There is another disadvantage in that characteristics of the material of the back cover 20, that is, ACM, make bending or folding difficult and require an additional middle cabinet 30, and, as a result, the number of components increases and the overall thickness of the display device increases.

FIG. 2 illustrates a different display device support structure proposed to compensate for the shortcomings of the structure disclosed in FIG. 1, and the different display device support structure includes a back cover 20 having an L-shaped section with a folded end, and an inner plate 60 attached to the inner surface of the back cover so as to supplement the rigidity of the back cover and to have a heat-dissipating function.

The back cover 20 is made of a pre-coated metal (PCM) material, which is made of a metal such as aluminum, and, since the characteristics of the metal material enable folding, the back cover includes a horizontal portion 22 that covers the entire back surface of the display device and a vertical extension portion 24 formed by folding an end of the horizontal portion in the vertical direction.

An adhesive member 44, such as a piece of double-sided tape, is attached to the inner surface of the periphery of the horizontal portion of the back cover 20, and the periphery of the display panel 10 is seated on and fixed to the upper portion of the adhesive member 44.

In the structure of FIG. 2, furthermore, the inner plate 60 made of a metal material is formed on the inner surface throughout the entire horizontal portion of the back cover.

The inner plate 60 is attached to the inner surface of the horizontal portion of the back cover through an adhesive member 44, such as a piece of double-sided tape, so as to increase the bending rigidity of the back cover and to have the function of a heatsink such that the same absorbs and dissipates heat that is discharged from the display panel 10, the control circuit C-PCB of the display panel, and the like.

Compared with the type of FIG. 1, the support structure of FIG. 2 is advantageous in that the lack of need to use the middle cabinet reduces the number of components and simplifies the structure, and the strength of the metal material PCM reduces the thickness of the back cover and thus the overall thickness of the display device.

However, there still exist drawbacks in that, even if the structure of FIG. 2 is used, the inner plate 60 or the back cover 20 needs to have a large thickness in order to secure sufficient rigidity of the support structure, meaning that sufficient rigidity cannot be secured if the inner plate has a small thickness.

When the display device is driven, furthermore, heat generated from the display panel, the control circuit, or the like is transferred to the inner plate, and the adhesive member, such as a piece of double-sided tape, arranged between the inner plate and the back cover does not normally have excellent thermal conductivity, thereby posing the concern of poor heat-dissipating characteristics.

In the structure of FIG. 2, furthermore, the back cover 20 needs to have a small thickness in line with the trends towards compactness of display devices, and such a small thickness of the back cover weakens the rigidity of the back cover, particularly the rigidity of the vertical extension portion, making it difficult to reduce the thickness of the back cover below a predetermined extent.

Furthermore, the inner plate 60 has a sharp exposed end, which may damage the adhesive member 44 for fixing the display panel, and may further entail a concern of cracking of the display panel.

In addition, if the display panel moves downwards due to damage of the adhesive member 44 for fixing the display panel, for example, the inner plate 60 made of a strong material may collide with the display panel and cause defects resulting from cracks.

In light of the above-mentioned problems, therefore, a downward-bending portion is formed on the periphery of the inner plate, which is attached by an adhesive member to the inner surface of the back cover that supports the rear side of the display panel, such that the downward-bending portion contacts the surface of the back cover, according to an aspect of the present disclosure, in order to improve the rigidity and heat-dissipating characteristics of the inner plate and to guarantee that elastic deformation of the downward-bending portion can prevent the display panel from cracking.

In addition thereto, furthermore, an inward-bending portion is also formed on the periphery of the vertical extension portion of the back cover in order to supplement the rigidity of the back cover and to guarantee that elastic deformation of the bending portion can prevent the display device from being damaged by lateral impacts.

Figure 3A:
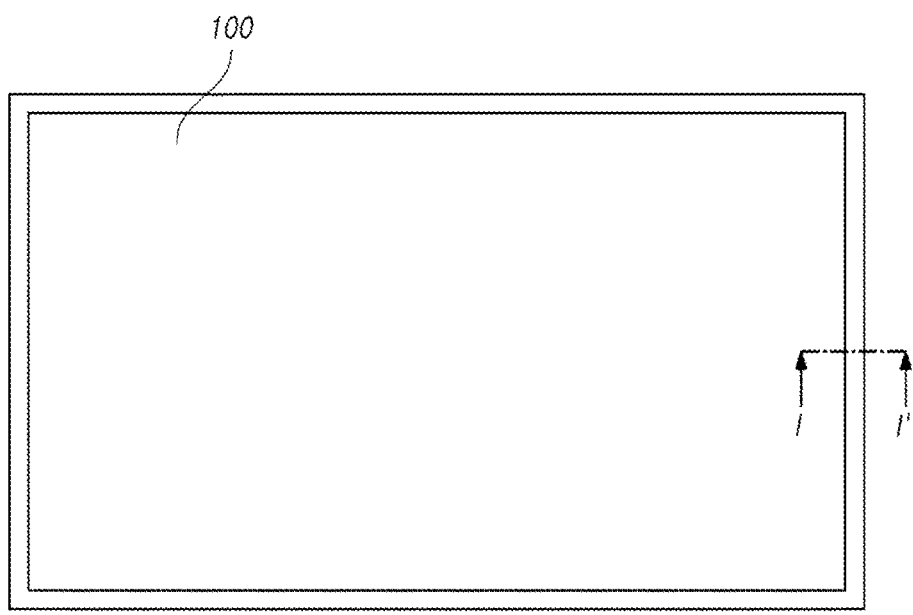
FIG. 3A and FIG. 3B illustrate cross-sectional views of a display device including a back cover and an inner plate according to an aspect of the present disclosure.
Figure 3B:
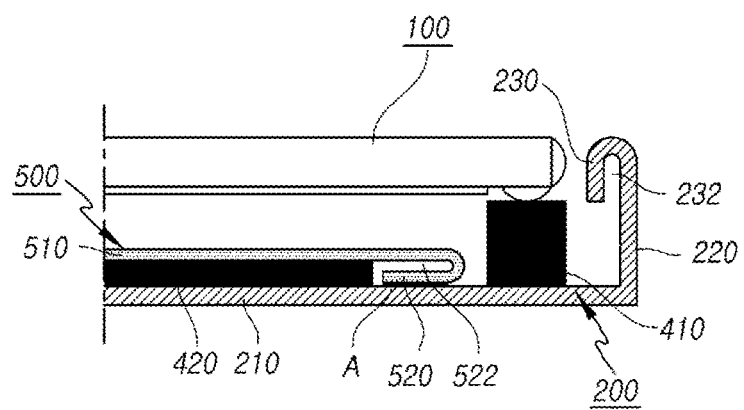

FIG. 3A and FIG. 3B illustrate cross-sectional views of a display device including a back cover and an inner plate according to an aspect of the present disclosure.

As illustrated in FIG. 3B, the display device according to the present aspect includes a display panel 100 for displaying images; a back cover 200 including a horizontal portion 210 that supports the rear side of the display panel and a vertical extension portion 220 that extends vertically from an end of the horizontal portion so as to cover the side surface of the display panel; and an inner plate 500 attached to the inner surface of the horizontal portion of the back cover through an adhesive member 420, the inner plate 500 including a downward-bending portion 520 bent downward from an end thereof so as to contact the inner surface of the horizontal portion of the back cover.

In addition to forming the downward-bending portion on the inner plate 500, the display device according to the present aspect may have an inward-bending portion 230 additionally formed by bending a part of the vertical extension portion 220 of the back cover 200 inwards, that is, toward the side surface of the display panel.

The inner plate 500 is a panel-shaped member made of a pre-coated material (PCM), which may be made of aluminum or an alloy thereof, for example, and includes a horizontal portion 510, which is a part attached to the inner surface of the back cover by an adhesive member 420, and a downward-bending portion 520 that is folded from the periphery of the horizontal portion toward the back surface of the display device, that is, in the downward direction.

The downward-bending portion 520 of the inner plate contacts the inner surface of the horizontal portion 510 of the back cover 200, and the contact area in which the downward-bending portion 520 and the back cover contact each other is indicated by A in FIG. 3B.

Specifically, as illustrated in FIG. 3B, the bottom surface of the horizontal portion 510 of the inner plate is attached and mounted on a surface of the adhesive member 420, such as a piece of double-sided tape, attached to the horizontal surface of the back cover 200, and, in this state, the bottom surface of the downward-bending portion 520 directly contacts the surface of the horizontal surface of the back cover.

Therefore, heat transferred to the inner plate 500 can be transferred to the back cover 200, which may also be made of a metal material, and discharged to the outside through the contact area A in which the downward-bending portion 520 and the back cover contact each other, thereby improving the heat-dissipating characteristics of the display device compared with the related art illustrated in FIG. 2.

Compared with the configuration of FIG. 2, which has no downward-bending portion 520, furthermore, the downward-bending portion 520 can increase the rigidity of the inner plate 500, particularly the bending rigidity, and thus is advantageous in that the overall strength of the display device is improved, or the thickness of the back cover or the inner plate can be reduced under the same strength condition.

Furthermore, there exists a predetermined gap between the horizontal portion 510 of the inner plate 500 and the downward-bending portion 520 thereof, and the gap is referred to as a second gap 522. The downward-bending portion 520 is given an elastic force in the vertical direction by the second gap 522, and thus can undergo a predetermined range of elastic deformation in response to a load in the vertical direction.

The fact that the peripheral portion of the inner plate is given an elastic force by the second gap 522 of the downward-bending portion 520 is advantageous in that, even if the display panel 100 moves downward and collides with the inner plate as a result of damage to the adhesive member 410 for fixing the display panel or due to a strong impact in the vertical direction, the impact can be absorbed to a predetermined extent, thereby preventing the display panel from cracking, for example.

In other words, the downward-bending portion 520 is supported on the back cover by the contact area A, and the second gap 522 is formed between the downward-bending portion 520 and the horizontal portion 510 of the inner plate, as illustrated in FIG. 3B; accordingly, when the display panel 100 collides with the inner plate due to a downward impact, for example, the inner plate can undergo elastic deformation and absorb the impact.

In addition, the inward-bending portion 230 may be further formed by bending a part of the vertical extension portion 220 of the back cover 200 toward the side surface of the display panel, that is, in an inward direction, and a predetermined gap is formed between the vertical extension portion 220 and the inward-bending portion 230, and this gap is referred to as a first gap 232.

The inward-bending portion 230 of the back cover is advantageous in that, compared with the related art of FIG. 2, not only is the rigidity of the peripheral area of the back cover, particularly bending rigidity improved, but the peripheral portion of the back cover also has a soft rounding effect.

Furthermore, the first gap 232 between the inward-bending portion 230 of the back cover 200 and the vertical extension portion 220 thereof enables the inward-bending portion 230 to exhibit an elastic force and to undergo a predetermined degree of elastic deformation, and such an elastic force can prevent the panel from being damaged by lateral impacts.

Specifically, provided that the display panel is pushed and moved toward the periphery by a lateral impact, for example, the structure of FIG. 2 entails the possibility that the display panel will directly collide with the vertical extension portion of the back cover and get damaged, while, according to the present aspect, the inward-bending portion of the back cover deforms elastically and absorbs the impact, thereby preventing the display panel from being damaged by cracks or the like.

Furthermore, when an impact is applied to the side surface of the display device because the display device is dropped to the ground, for example, the first gap 232 enables the inward-bending portion 230 of the back cover to absorb a predetermined part of the impact, thereby protecting the display device from the lateral impact.

As used herein, the inner side or the inner surface may include the direction toward the inner portion of the display device or the surface lying in that direction, and the lower side or the outer surface may include the direction toward the outside of the display device or the surface lying in that direction.

Specifically, in FIG. 3B, the inner side of the vertical extension portion 220 of the back cover may include the direction facing from right to left, and the lower side of the inner plate may include the direction facing from the upside to the downside.

Figure 4A:
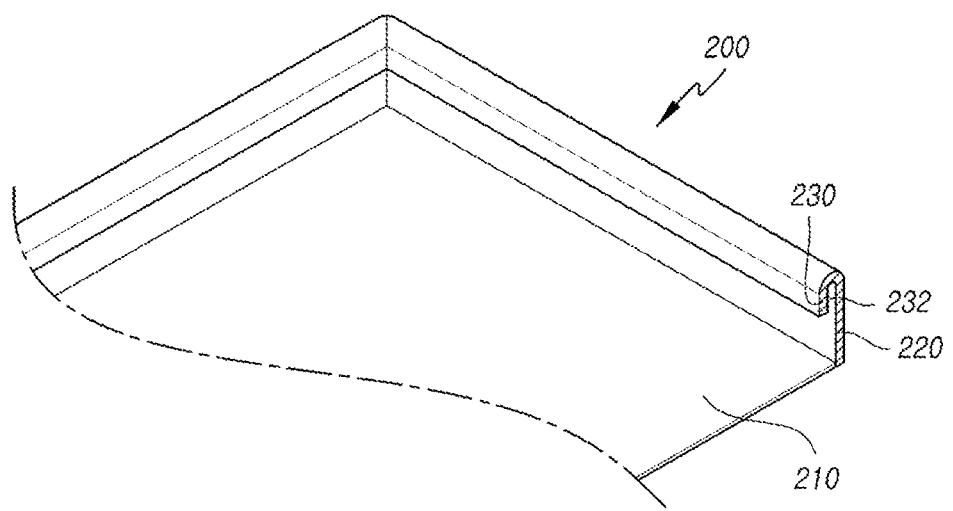
FIG. 4A and FIG. 4B are partial perspective views of a back cover and an inner plate used in the present aspect, illustrating a configuration in which an inward-bending portion is formed at an end of a vertical extension portion of the back cover and a downward-bending portion is formed at an end of the inner plate.
Figure 4B:
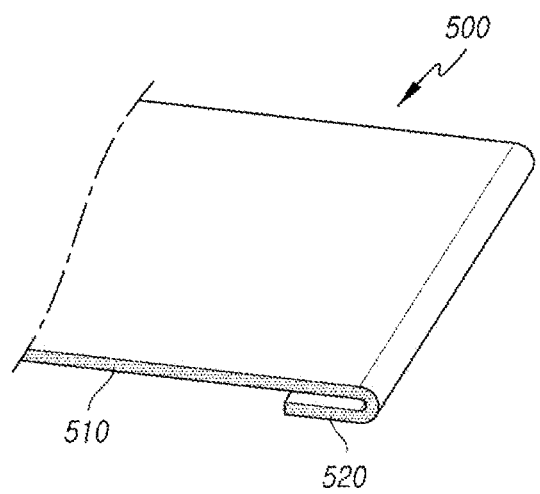
Figure 5:
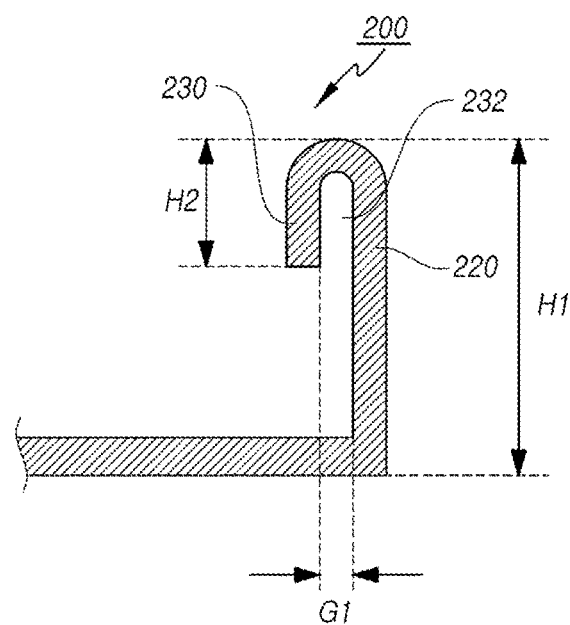
FIG. 5 is a magnified view of the inward bending portion formed at the vertical extension portion of the back cover according to the present aspect.

FIG. 4A and FIG. 4B are partial perspective views of the back cover and the inner plate used in the present aspect, illustrating a configuration in which an inward-bending portion is formed at an end of a vertical extension portion of the back cover and in which a downward-bending portion is formed at an end of the inner plate. FIG. 5 is a magnified view of an inner bending portion formed on the vertical extension portion of the back cover according to the present aspect.

As illustrated in FIG. 4A, the back cover 200 may include a panel-shaped member having a predetermined thickness, and may include a horizontal portion 210 that forms the back surface of the display device and a vertical extension portion 220 folded from the periphery of the horizontal portion 201 so as to extend in the vertical direction; accordingly, the back cover 200 may have a panel-shaped member with an L-shaped section as a whole.

Furthermore, the back cover 200 according to the present aspect may include an upward bending portion 230 formed by folding the periphery of the vertical extension portion 220 toward the side surface of the display panel, that is, in an inward direction, and a predetermined gap, particularly a first gap 232, may be formed between the vertical extension portion 220 and the inward-bending portion 230.

Such a vertical extension portion and/or inward-bending portion may be provided on all four surfaces of the back cover, but is not limited thereto, and may be formed on only some of the four surfaces of the back cover according to the arrangement design of the control circuit and the like.

Meanwhile, the "back cover" 200, as referred to herein, is not limited to the term, and may be referred to by other terms, such as a plate bottom, a cover bottom, a base frame, a metal frame, a metal chassis, a chassis base, an m-chassis, etc. Furthermore, the back cover may be construed as including all forms of frames or panel-shaped structures disposed on the rear base part of the display device as a support body that supports the display panel.

The term "display device" used herein includes not only a display device in the narrow sense of the word (such as a liquid crystal module (LCM), an OLED module, etc.) that includes a display panel and a drive unit for driving the display panel, but also an electronic set device or a set device (such as a notebook computer, a television, a computer monitor, a mobile electronic device, including a smart phone or an electronic pad, etc.) that includes an LCM, an OLED module, etc.

Namely, the display device used herein includes not only a display device in the narrow sense of the word (such as an LCM, an OLED module, etc.) but also a set device that is an application product including the same.

Meanwhile, the back cover 200 according to the present aspect may be made of a thermally conductive metal and a metal-containing material, and may be configured using, but is not limited to, a pre-coated metal (PCM) material obtained by painting a polyester resin on electrolytic galvanized iron (EGI), a molten zinc-plated steel plate, a galvarium steel plate, an aluminum-plated steel plate, an electrolytic galvanized steel plate, or the like, or by attaching a lami film or the like to a color steel plate.

In addition, the thickness of the back cover 200 may be, but is not limited to, about 0.5 mm, or may be smaller than the thickness of the back cover of the configuration as illustrated in FIG. 2, that is, about 1.8 mm.

In other words, according to the present aspect, the inward-bending portion formed on the back cover and the downward-bending portion formed on the inner plate increase rigidity, and thus can reduce the thickness of the back cover compared with the case (FIG. 2) in which such bending portions are not used.

Consequently, the present aspect can reduce the overall thickness and weight of the display device.

As illustrated in FIG. 5, the height H2 of the inward-bending portion 230 of the back cover is smaller than the height H1 of the vertical extension portion 220 of the back cover and, more specifically, may be equal to or smaller than the value obtained by subtracting the thickness of the adhesive member 410 for fixing the display panel in FIG. 3B from the height H1 of the vertical extension portion of the back cover, but is not limited thereto.

In addition, the size G1 of the gap between the vertical extension portion 220 of the back cover and the inward-bending portion 230 thereof, that is, the first gap 232, may be determined as appropriate in view of the convenience in the process of bending the inward-bending portion, the degree of required elastic deformation of the inward-bending portion, and the like.

The inner plate 500 according to the present aspect may include a panel-shaped member mounted on the inner surface of the horizontal portion of the back cover 200 through an adhesive member 420, and may include a horizontal portion 510, which is a flat panel portion attached to the adhesive member 420, and a downward-bending portion 520, which is formed by folding the periphery of the horizontal portion downward, and which contacts the inner surface of the horizontal portion of the back cover.

Furthermore, a predetermined gap G2 may be formed between the horizontal portion 510 of the inner plate 500 and the downward-bending portion 520 thereof, and the gap is defined as a second gap 522.

The downward-bending portion 520 has the following three functions:

Firstly, the downward-bending portion 520 has the function of increasing the overall rigidity of the inner plate. Specifically, the peripheral portion has double bending, compared with a normal inner plate of a flat panel type, and can increase the overall bending rigidity of the inner plate.

Secondly, the downward-bending portion 520 has the function of improving the heat-dissipating characteristics of the inner plate. In the structure of FIG. 2, which has no downward-bending portion, the inner plate is attached to the back cover by an adhesive member 46, which is a piece of double-sided tape made of a material having almost no thermal conductivity. Consequently, even if the inner plate made of a metal material absorbs heat discharged from the display panel or the control circuit, it plays hardly any role in transferring the heat to the outside and discharging the same.

In contrast, the downward-bending portion 520 according to the present aspect, if provided, contacts the inner surface of the back cover such that heat generated from the display panel, the control circuit, and the like can be easily discharged to the outside through the downward-bending portion of the inner plate and the back cover.

Specifically, when the display panel is an organic light-emitting display panel, the organic light-emitting element may be vulnerable to heat, making it more critical to improve the heat-dissipating performance by the downward-bending portion of the inner plate.

Thirdly, the downward-bending portion 520 of the inner plate has a function of absorbing vertical impacts by means of elastic deformation.

When the display device is subjected to a vertical load or impact, or when the adhesive member 44 (shown in FIG. 2) for fixing the display panel is damaged, the display panel may move downward and contact the inner plate.

In this case, the related art of FIG. 2 has no downward-bending portion, and the inner plate has a single flat-panel structure, and cannot absorb the amount of impact resulting from collision of the display panel, posing the concern that the display panel may develop a defect such as fracturing or cracking.

In contrast, the downward-bending portion 520 having a second gap 522 according to the present aspect, if provided, can deform elastically when the inner plate is subjected to a downward load, thereby playing the role of a damper that absorbs the load.

In such a case, therefore, the impact is properly absorbed, even if the display panel collides with the inner plate, thereby preventing the panel from cracking due to the load or impact applied in the vertical direction of the display device.

Figure 6A:
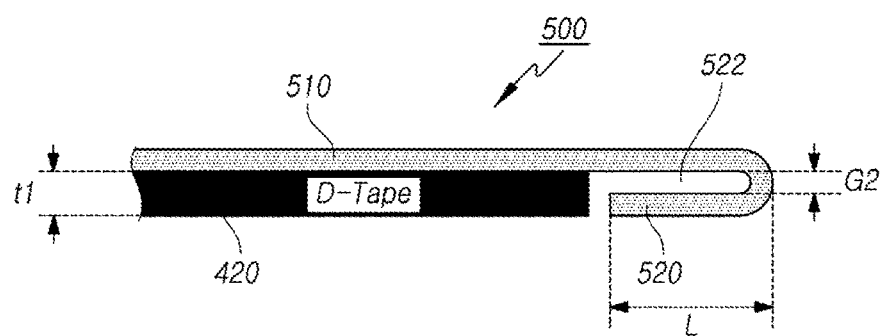
FIG. 6A, FIG. 6B, and FIG. 6C illustrate various types of the downward-bending portion formed at an end of the inner plate according to the present aspect.
Figure 6B:
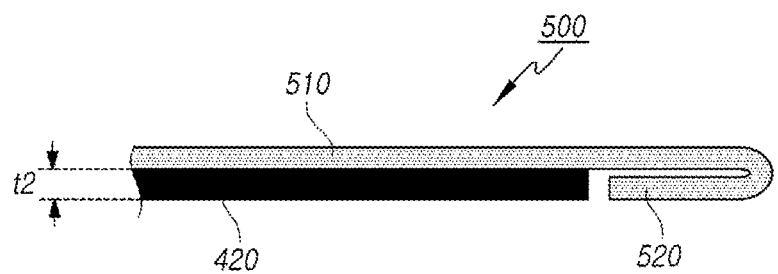
Figure 6C:
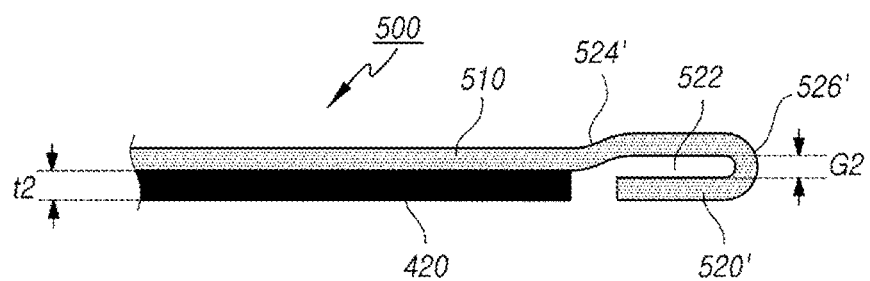

As illustrated in FIG. 6A, FIG. 6B, and FIG. 6C, on the other hand, the size G2 of the second gap 522 may be set appropriately depending on the default thicknesses of the adhesive member and the inner plate and the required degree of elastic deformation of the second gap of the inner plate.

Specifically, when the second gap 522 is formed with a predetermined size G2 as in FIG. 6A, the overall thickness of the inner plate increases, and the adhesive member 420 needs to have a large thickness t1, but the increased amount of elastic deformation improves the impact-absorbing performance.

When the second gap 522 is formed to have a very small value or an almost zero value, as illustrated in FIG. 6B, the degree of elastic deformation decreases to some extent, but the area of thermally conductive contact with the back cover increases. This is advantageous in that the heat-radiating characteristics can be improved, and the adhesive member 420 can have a small thickness t2.

FIG. 6C illustrates an exemplary structure designed to combine the advantages of both FIG. 6A and FIG. 6B, wherein the downward-bending portion 520' has a double folding structure.

Specifically, the downward-bending portion 520' of the inner plate is configured to include a primary folding portion 524' that is primarily folded upward from the horizontal portion 510 and a secondary folded portion 526' that is folded downward by 180°.

Consequently, the second gap has at least a secured size G2 while the adhesive member 420 has a small thickness t2, providing an advantage in that the mounting thickness of the inner plate can be reduced while maintaining the elastic deformation characteristics.

Furthermore, the length L of extension of the downward-bending portion of the inner plate can be set in view of the heat-dissipating characteristics, and advantageously has as a large value as possible.

Specifically, the length L of the downward-bending portion can be set as large as possible such that the horizontal portion of the inner plate has a sufficient area to attach the same to the back cover through the adhesive member 420, while the downward-bending portion covers all of the remaining area.

The inner plate 500 may be made of aluminum, an alloy thereof, or a different metal material, but is not limited thereto, and another material having at least a predetermined strength and heat-conductive characteristics may be used.

Meanwhile, the display panel 100 used for the display device according to the present aspect may be any type of display device such as a liquid crystal display panel, an organic light-emitting diode (OLED) display panel, or a plasma display panel (PDP), and is not limited to a specific display panel as long as the structures of the back cover and the inner plate according to the present aspect can be applied.

When the display panel is a liquid crystal display panel, however, a backlight unit including a light source, a light-guiding plate, an optical sheet, and the like needs to be provided between the display panel and the back cover or the cover bottom, and a support structure for supporting the backlight unit may be additionally required, and, considering that the liquid crystal material is more strongly resistant to heat than the organic light-emitting material as will be described later, there may be a low possibility that the inner plate according to the present aspect will be applied.

In the case of the organic light-emitting (OLED) display panel, in contrast, various layers including a light-emitting panel layer, which is a glass substrate including an organic light-emitting element, a thin-film transistor (TFT), and the like, and an encapsulation layer are integrated into a single panel in a single assembly type, and a self-light-emitting element is used as the organic light-emitting element, requiring no separate backlight unit such as a light source; therefore, the structures of the back cover and the inner plate according to the present aspect can be easily applied.

In addition, the organic light-emitting element or the organic light-emitting material, used for the organic light-emitting display panel, is more vulnerable to heat than the liquid crystal material, making heat radiation from the display device more critical; accordingly, there is a greater need for the inner plate according to the present aspect.

Therefore, the display panel 100 according to the present aspect may be an organic light-emitting (OLED) display panel.

Figure 7A:
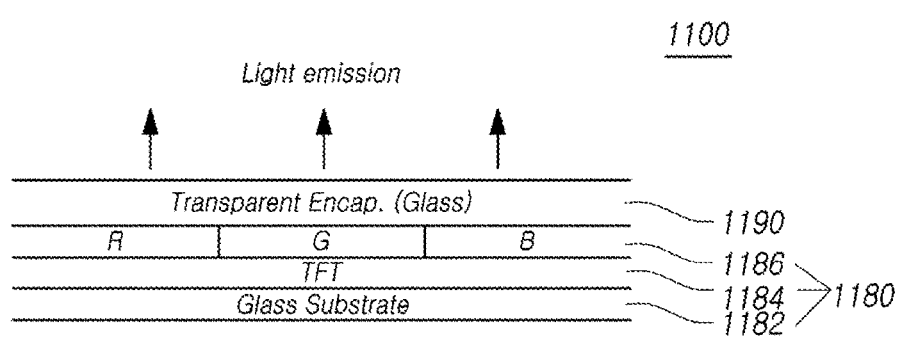
FIG. 7A, FIG. 7B, and FIG. 7C illustrate various cross-sectional structures of an organic light-emitting display panel used for a display device according to the present aspect.
Figure 7B:
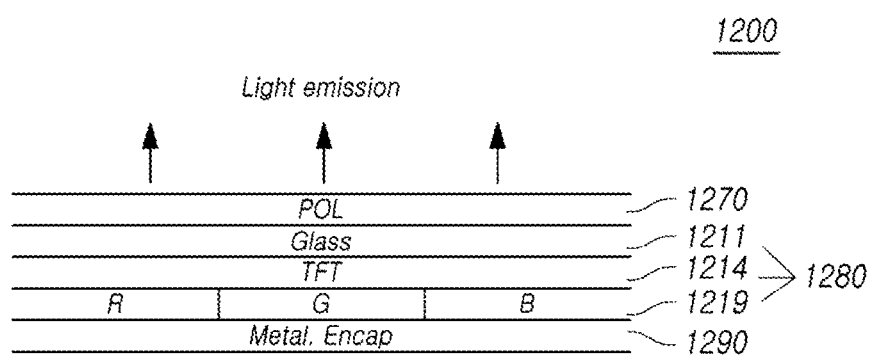
Figure 7C:
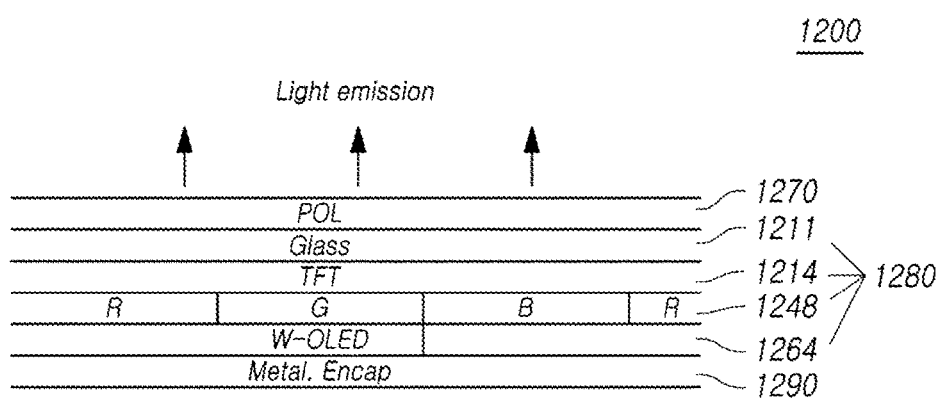

FIG. 7A, FIG. 7B, and FIG. 7C illustrate various cross-sectional structures of an organic light-emitting display panel used for a display device according to the present aspect.

As described above, the display panel used for the display device, to which the present aspect is applied, may be a liquid crystal display panel, an organic light-emitting display panel, or any other type, but may be more advantageously applied to a display device having an organic light-emitting display panel, considering the fact that no backlight unit is necessary, and the light-emitting element is vulnerable to heat, making the heat-radiating characteristics critical.

An organic light-emitting display panel 100 that can be used for the present aspect may include a light-emitting layer including a substrate, multiple thin-film transistors formed on the substrate, and an organic light-emitting element layer that emits light between two electrode layers arranged on one side of the thin-film transistors, and an encapsulation layer arranged on one side of the light-emitting layer.

Meanwhile, the organic light-emitting display panel according to the present aspect may be of a top-emission type or a bottom-emission type according to the direction of light propagating from the organic light-emitting element layer.

Described in brief, in the top-emission type, light generated by the organic light-emitting element layer propagates in the opposite direction of the substrate of the light-emitting layer, that is, in the upward direction, and a surface lying on the opposite the substrate serves as an image display surface.

In the bottom-emission type, in contrast, light generated from the organic light-emitting element layer propagates toward the substrate of the light-emitting layer and is discharged through the substrate, and the outer surface of the substrate of the light-emitting layer serves as the image display surface.

FIG. 7A is a cross-sectional diagram of the top-emission type display panel, in which light is emitted toward the thin-film transistor (TFT) with reference to the substrate of the light-emitting layer, among organic light-emitting display panels.

As illustrated in FIG. 7A, the top-emission type organic light-emitting display panel 1100 may include a light-emitting layer 1180 and an encapsulation layer 1900 arranged on one side of the light-emitting layer so as to protect the light-emitting layer.

The light-emitting layer 1180 is an array substrate portion including an organic light-emitting element layer that is self-light-emitting, and is formed by successively laminating a glass substrate 1182, multiple thin-film transistor layers 1184 formed on the glass substrate 1182, and an organic light-emitting element layer 1186 arranged on one side of the thin-film transistor layers.

Although not illustrated, there are arranged a first electrode (anode or cathode electrode), which is connected to the source or drain electrode of the thin-film transistors, and a second electrode (cathode or anode), and an organic light-emitting element layer 1186 is arranged between the two electrode layers.

The switching operation of the thin-film transistors generates a potential difference between the two electrodes, according to which the organic light-emitting element conducts self-light-emission and discharge light.

Meanwhile, a substrate made of a glass material prevents the inflow of external moisture, foreign substances, and the like toward one of the two side surfaces of the light-emitting layer, on which the glass substrate is arranged, thereby preventing a problem; however, moisture, foreign substances, and the like may flow into the surface on which the organic light-emitting display layer is formed, generating a need to protect the same.

The encapsulation layer 1182 is a protective layer used to this end, and is bonded to the upper surface of the organic light-emitting element layer so as to prevent the organic light-emitting element from being damaged.

The term "encapsulation layer", as used herein, is not limiting terminology, and is to be understood as including all types of protective layers arranged to protect the organic light-emitting element layer of the light-emitting layer that constitutes the organic light-emitting display panel, and other expressions such as a protective layer and a second substrate layer may also be used to denote the same.

In the top-emission type as illustrated in FIG. 7A, light is discharged in the opposite direction of the glass substrate 1182 of the light-emitting layer, an image display surface is formed in that direction, and an encapsulation layer 1190 is formed toward the image display device, that is, on the outer surface of the organic light-emitting element layer 1186.

In the top-emission type as illustrated in FIG. 7A, furthermore, the encapsulation layer 1190 is arranged on the image display surface and needs to be transparent, meaning that a glass material, for example, needs to be used. In the top-emission type, the encapsulation layer 1190 also constitutes an image display device that is exposed to the observer, and needs to have at least a predetermined level of rigidity against external impacts.

In the top-emission type, therefore, the encapsulation layer 1190 needs to be formed as a glass layer having a comparatively large thickness T1, and, in the case of a large TV, for example, the first thickness T1 of the encapsulation layer 1190 needs to be at least 1 mm.

FIG. 7B and FIG. 7C are cross-sectional diagrams of a bottom-emission type organic light-emitting display panel. FIG. 7B corresponds to the case in which a color-wise glass light-emitting layer is applied, and FIG. 7C corresponds to the case in which a white organic light-emitting layer (WOLED) and a color filter layer are used. FIG. 7B will be referred to as a representative example in the following description.

As illustrated in FIG. 7B, an organic light-emitting display panel 1200 that can be used for a display device according to an aspect of the present disclosure may include an encapsulation layer 1290, a light-emitting layer 1280 arranged on the encapsulation layer, and a polarizing layer 1270 arranged on the light-emitting layer.

The light-emitting layer 1280 may include an array substrate portion including an organic light-emitting element layer that conducts self-light-emission, and is formed by successively laminating a substrate 1211 made of a glass material, multiple thin-film transistor layers (TFT) 1214 formed on the substrate 1211, and an organic light-emitting element layer 1219 arranged on one side of the thin-film transistor layers.

As will be described in more detail with reference to FIG. 8, there are arranged a first electrode (anode or cathode electrode), which is connected to the source or drain electrode of the thin-film transistors, and a second electrode (cathode or anode), and an organic light-emitting element layer 1219 is arranged between the two electrode layers.

The switching operation of the thin-film transistors generates a potential difference between the two electrodes, according to which the organic light-emitting element conducts self-light-emission and discharges light.

A surface of the polarizing layer 1270 serves as an image display surface on which images are displayed, and, below the image display surface, the polarizing layer 1270, the light-emitting layer 1280, and the encapsulation layer 1290 are successively arranged; in some cases, the polarizing layer 1270 may be omitted.

FIG. 7B illustrates the case of using an organic light-emitting material, which outputs light for respective colors (R, G, B), for the organic light-emitting element layer 1219 that constitutes the light-emitting layer 1280 with no separate color filter; and FIG. 7C illustrates the case in which the organic light-emitting element layer is a white organic light-emitting element layer 1264 that emits white light, and a color filter layer 1248 is arranged on the white organic light-emitting element layer.

In the case of the bottom-emission type organic light-emitting display panel 120 illustrated in FIG. 7B and FIG. 7C, the light-emitting layer 1280 has a substrate 1211, a thin-film transistor layer 1214, and an organic light-emitting element layer 1219 successively arranged below the image display surface.

In this state, light emitted from the organic light-emitting element layer propagates through the thin-film transistor layer 1214 and the substrate 1211. Therefore, the bottom-emission type means that, assuming that the substrate 1211 is on the bottom side, light is emitted toward the substrate.

In the case of such a bottom-emission type organic light-emitting display panel 1200, an encapsulation layer 1290 is arranged adjacent to the organic light-emitting element layer 1219 in order to protect the organic light-emitting element layer 1219.

Therefore, the top-emission type encapsulation layer 1190 (shown in FIG. 7A) is arranged on the image display surface, while, in the bottom-emission type illustrated in FIG. 7B and FIG. 7C, the encapsulation layer 1290 is arranged on the opposite side of the image display surface, and thus needs neither to be made of a transparent material nor to have enough rigidity to protect the same from external impacts.

In other words, the encapsulation layer 1290 in the bottom-emission type has only to have a function of preventing the penetration of moisture, foreign substances, and the like into the organic light-emitting element layer of the light-emitting layer 1280.

Therefore, the encapsulation layer 1290 of the organic light-emitting display panel according to the present aspect may be made of a metal material thin film, for example, having a second thickness T2 smaller than the first thickness T1 of the encapsulation layer 1190 of the top-emission type described above.

The encapsulation layer 1290 of the organic light-emitting display panel according to the present aspect may actually have a second thickness of about 0.05-0.2 mm.

Furthermore, the material of the encapsulation layer 1290 of the organic light-emitting display panel according to the present aspect is not limited to a metal, and the material is not limited in any manner as long as the same can be made of a thin film capable of protecting the organic light-emitting element layer.

However, the encapsulation layer 1290 may be made of iron-nickel alloy, also referred to as an invar metal material, which prevents the penetration of hydrogen/oxygen, in order to prevent oxidation of the organic light-emitting element from occurring due to the penetration of hydrogen, oxygen, or the like into the organic light-emitting element layer 1219.

The encapsulation layer 1290 may be made of a metal material having at least a predetermined level of reflectivity.

This is because the light emitted from the organic light-emitting element layer 1219 needs to be output to the image display device, which is directed to the opposite side of the encapsulation layer 1290, and the encapsulation layer 1290, if made of a metal material having at least a predetermined level of reflectivity, can play a role of a reflecting plate and thus improve the optical efficiency of the display panel.

As such, the bottom-emission type organic light-emitting display panel according to an aspect of the present aspect is advantageous in that the thickness of the encapsulation layer can be reduced, compared with the top-emission type illustrated in FIG. 7A, and the optical efficiency of the display panel can be improved according to the reflective characteristics of the encapsulation layer 1290.

This is because the light emitted from the organic light-emitting element layer 1219 needs to be output to the image display device, which is directed to the opposite side of the encapsulation layer 1290, as illustrated in FIG. 7B and FIG. 7C, and the encapsulation layer 1290, if made of a metal material having at least a predetermined level of reflective characteristics, can play a role of a reflecting plate and thus improve the optical efficiency of the display panel.

Unlike FIG. 7B, to which a color-wise glass light-emitting layer is applied, FIG. 7C illustrates an exemplary configuration in which the organic light-emitting element layer is a white organic light-emitting element layer (WOLED) 1264 that emits white light, and a color filter layer 1248 is arranged on the white organic light-emitting element layer.

The optical efficiency of white organic light-emitting elements is generally better than that of other color-wise organic light-emitting elements, and the use of the structure illustrated in FIG. 7C can further improve the optical efficiency of the organic light-emitting display device.

Figure 8:
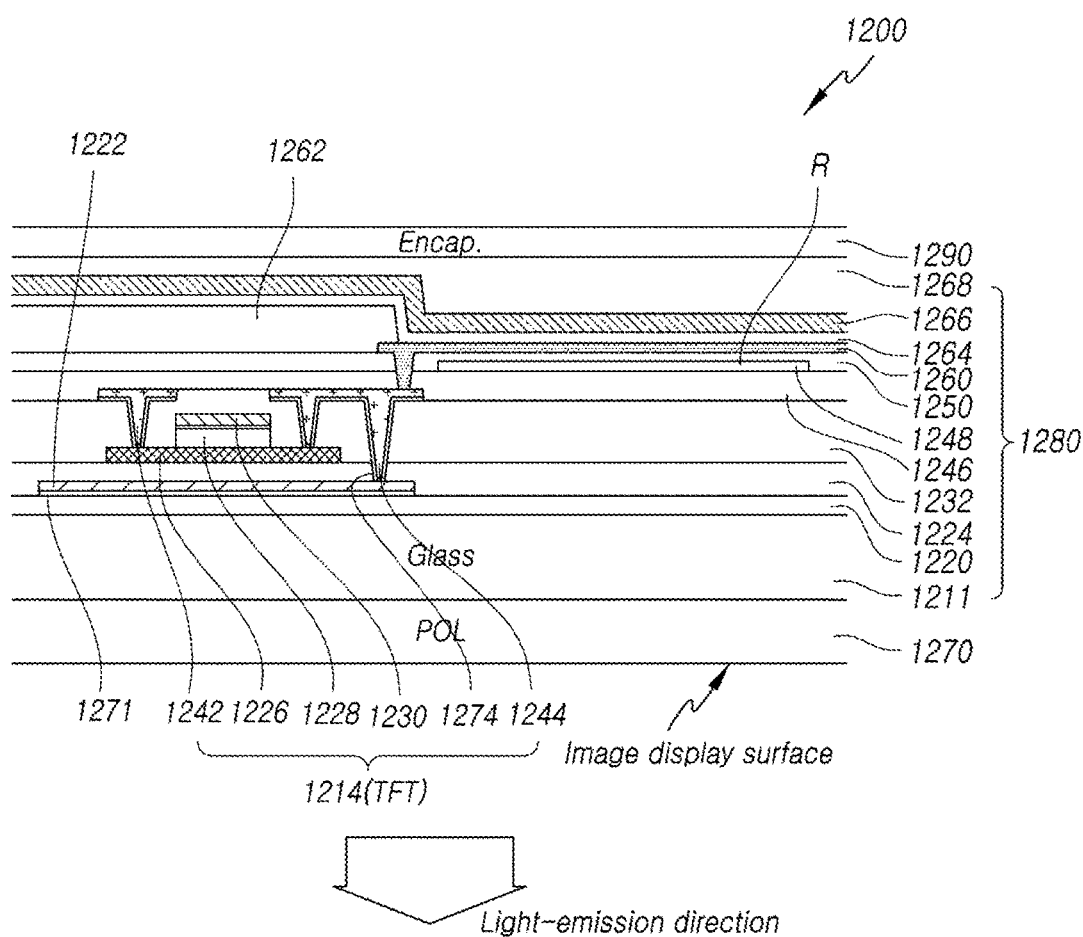
FIG. 8 is a detailed cross-sectional view illustrating a lamination structure of a bottom-emission type organic light-emitting display panel that can be used in the present aspect.

FIG. 8 is a detailed sectional diagram illustrating a lamination structure of a bottom-emission type organic light-emitting display panel that can be used in the present aspect.

It is assumed for the sake of convenience that the light-emitting direction or the image display surface in FIG. 8 is toward the bottom of the drawing, unlike the case of FIG. 7.

As illustrated in FIG. 8, a polarizing layer 1270 is arranged on the image display device, a light-emitting layer 1280 is laminated to contact the same, and an encapsulation layer 1290 is arranged on the surface of the light-emitting layer 1280.

The detailed configuration of the light-emitting layer 1280 of the bottom-emission type organic light-emitting display panel used in the present aspect will now be described.

On the substrate 1211 of the light-emitting layer 1280, there may be arranged a buffer layer 1220, a light-blocking layer 1222, a first interlayer insulator 1224, a semiconductor layer 1226, a gate insulator 1228, a gate electrode 1230, a second interlayer insulator 1232, a source electrode 1242, a drain electrode 1244, a third interlayer insulator 1246, a color filter 1248, a flattening layer 1250, a first electrode 1260, a bank 1262, an organic light-emitting element layer 1264, a second electrode 1266, a passivation layer 1270, and the like.

The substrate 1211 of the light-emitting layer 1280 may be a glass substrate, but is not limited thereto, and may be a plastic substrate including polyethylene terephthalate (PET), polyethylene naphthalate (PEN), polyimide, and the like.

The buffer layer 1220 may prevent the penetration of impure elements into the substrate 1211 or improve the interface characteristics and flatness, and may be formed as a single layer or multiple layers made of silicon nitride (SiNx), silicon oxide (SiOx), and the like.

The light-blocking layer 1222 may block light incident on the channel area of the semiconductor layer 1226, and, to this end, the light-blocking layer 1222 may be made of an opaque metal layer for blocking light. The light-blocking layer 1222 may also be electrically connected to the drain electrode 1244 to prevent parasitic capacitance.

The first interlayer insulator 1224 may insulate the light-blocking layer 1222 and the semiconductor layer 1226 from each other. The first interlayer insulator 1224 may include an insulating material and may be laminated on the buffer layer 1220 and the light-blocking layer 1222.

The semiconductor layer 1226 may include silicon (Si) and may be arranged on the first interlayer insulator 1224. The semiconductor layer 1226 may include an active area that constitutes a channel and a source area and a drain area, which are positioned on both sides of the active area, respectively, and which are doped with high-density impurities.

The gate insulator 1228 may insulate the semiconductor layer 1226 and the gate electrode 1230 from each other. The gate insulator 1228 may include an insulating material and may be laminated on the semiconductor layer 1226.

The gate electrode 1230 may be arranged on the gate insulator 1228 and is supplied with a gate voltage from a gate line.

The second interlayer insulator 1232 may protect the gate electrode 1230 and insulate the gate electrode 1230, the source electrode 1242, and the drain electrode 1244 from one another. The second interlayer insulator 1232 may include an insulating material and may be laminated on the first interlayer insulator 1224, the semiconductor layer 1226, and the gate electrode 1230.

Each of the source electrode 1242 and the drain electrode 1244 may be arranged on the second interlayer insulator 1232, and may contact the semiconductor layer 1226 via first and second contact holes formed on the second interlayer insulator 1232. The drain electrode 1244 may contact the light-blocking layer 1222 via a third contact hole.

The source electrode 1242 and the drain electrode 1244, the semiconductor layer 1226 that may contact these electrodes, the gate insulator 1228 formed on the semiconductor layer 1226, the gate electrode 1230, and the like may constitute the thin-film transistor layer 1214.

The third interlayer insulator 1246 may protect the source electrode 1242 and the drain electrode 1244.

The color filter 1248 may be arranged on the second interlayer insulator 1232 and positioned to overlap the organic light-emitting element layer 1216 in order to change the color of the light emitted toward the substrate 1211 in the bottom-emission type.

The flattening layer 1250 may protect the source electrode 1242 and the drain electrode 1244 and may flatten the surface on which the first electrode 1260 is arranged.

The first electrode 1260 may be arranged on the flattening layer 1250 and may contact the drain electrode 1244 via a fourth contact hole formed on the flattening layer 1250. The first electrode 1260 may play a role of an anode and may be made of a transparent conductive material that has relatively a large work function value such that light generated from the organic light-emitting element layer 1264 passes through the same.

For example, the first electrode 1260 may be made of a metal oxide such as indium tin oxide (ITO) or indium zinc oxide (IZO), a mixture of a metal and an oxide such as ZnO:Al or SnO2:Sb, or a conductive polymer such as poly(3-methylthiophene), poly[3,4-(ethylene-dioxy)thiophene] (PEDT), polypyrrole, and polyaniline. The first electrode 260 may also be made of carbon nanotubes (CNT), graphene, silver nanowires, or the like.

The organic light-emitting element layer 1264 may be arranged on the first electrode 1260 and may be configured as a single layer made of a light-emitting material, or may be configured as multiple layers including a hole injection layer, a hole transportation layer, a light-emitting layer, an electron transportation layer, and an electron injection layer. The organic light-emitting element layer 1264 may be a white-light organic light-emitting element layer that outputs white light, and may be applied to the front surface without patterning. The organic light-emitting element layer 1264 may make the manufacturing process convenient or reduce the costs because the patterning process can be omitted.

The second electrode 1266 may be arranged on the organic light-emitting element layer 1264 and, as a cathode electrode (negative electrode), may be made of a conductive material having a comparatively small work function value. The second electrode 1266 may be configured as a single layer made of a single metal such as Ag, a single layer made of an alloy containing a predetermined proportion of Mg, for example, or multiple layers including the same, according to the bottom-emission type.

The first electrode 1260 connected to the thin-film transistors, the second electrode 1266 arranged opposite the first electrode 1260, and the organic light-emitting element layer 1264 interposed between the first electrode 1260 and the second electrode 1266 may be referred to as an organic light-emitting element as a whole.

When a predetermined voltage is applied to the first electrode 1260 and the second electrode 1266 in connection with the organic light-emitting element layer 1264, holes injected from the first electrode 1260 and electrons provided from the second electrode 1266 may be transported to the organic light-emitting element layer 1264 and constitute an exciton, and light may be generated, when the exciton undergoes transition from the excited state to the ground state, and may be discharged as visible rays.

The bank may be formed on the periphery of the first electrode 1260 and may have an opening such that the first electrode 1260 is exposed. The bank may be made of an inorganic insulating material such as $SiO_x$, $SiN_x$, SiON, and the like.

The passivation layer 1270 may play a role of protecting the organic layer from moisture and oxygen and may be configured in a multilayered structure including an inorganic material, an organic material, and a mixture thereof.

The upper portion of each of the light-blocking layer 1222, the gate electrode 1230, the source electrode 1242, and the drain electrode 1244 may include one low-reflectivity layer 1271. The low-reflectivity layer may prevent the reflection of external light and avoid problems such as visibility degradation, luminance decrease, contrast ratio characteristics decrease, and the like.

The low-reflectivity layer 1271 may be made of a material that absorbs external light introduced through the substrate 1211, or may have a light-absorbing agent applied thereto. As used herein, the external light may non-polarized light that has not passed through a polarizing plate or a polarizing layer.

The material that absorbs external light may be made of metals that absorb light or an alloy thereof, and may have a black-based color. For example, the low-reflectivity layer 1271 may be made of one selected from molybdenum (Mo), chromium (Cr), titanium (Ti), niobium (Nb), manganese (Mn), and tantalum (Ta), or an alloy thereof. However, aspects may not be limited thereto, and may include another metal that can absorb light. Accordingly, the low-reflectivity layer 1271 can prevent external light from being reflected to the outside again.

The low-reflectivity layer 1271 may be made of a metal oxide or an alloy of a metal that absorbs light and a metal oxide, thereby blocking light introduced from the outside. For example, the low-reflectivity layer 1271 may be made of a metal oxide, such as indium tin oxide (ITO), indium zinc oxide (IZO), indium tin zinc oxide (ITZO), and the like. A part of the external light, which has been reflected at the surface of the low-reflectivity layer 1271, and another part of the external light, which has passed through the low-reflectivity layer 1271 and then has been reflected at the interface between the conductive layer and the low-reflectivity layer 1271, cause interference that counterbalance each other, failing to escape to the outside again.

Meanwhile, the organic light-emitting display panel 1200 according to the present aspect may further include a transmittance-adjusting film (not illustrated) arranged on the surface of the substrate 1211 so as to absorb light having visible domain wavelengths and/or a transparent multilayered film (not illustrated).

The transmittance-adjusting film has a predetermined transmittance and is configured to absorb light, which is incident on the substrate 1211 from the outside, and to substantially decrease the reflectivity of the substrate 1211 by absorbing the external light.

The transparent multilayered film may be structured to have a plurality of refractive layers laminated such that adjacent layers have different refractive indices, and is configured to reduce the reflectivity of external light by extinguishing the external light using destructive interference between rays of light reflected by refractive layers having various refractive indices.

The transmittance-adjusting film and/or the transparent multilayered film may constitute the above-mentioned polarizing layer 1270 itself or a part thereof.

As described above, aspects of the present disclosure are advantageous in that a downward-bending portion is formed at an end of the inner plate arranged on the inner surface of the back cover, which is a back support structure of the display device, such that the outer surface of the downward-bending portion contacts the inner surface of the back cover, thereby improving the rigidity and heat-radiating characteristics of the inner plate, and guaranteeing that the elastic force from the downward-bending portion prevents the display panel from being damaged by cracks.

There is another advantage in that, by forming an inward-bending portion at the front end of the vertical extension portion of the back cover, the rigidity of the back cover is improved, and elastic deformation of the inward-bending portion can protect the display device from lateral impacts.

The above description and the accompanying drawings provide an example of the technical idea of the present disclosure for illustrative purposes only. Those having ordinary knowledge in the technical field, to which the present disclosure pertains, will appreciate that various modifications and changes in form, such as combination, separation, substitution, and change of a configuration, are possible without departing from the essential features of the present disclosure. Therefore, the aspects disclosed in the present disclosure are intended to illustrate the scope of the technical idea of the present disclosure, and the scope of the present disclosure is not limited by the aspect. The scope of the present disclosure shall be construed on the basis of the accompanying claims in such a manner that all of the technical ideas included within the scope equivalent to the claims belong to the present disclosure.

What is claimed is:

1. A display device comprising:
    a display panel having a rear side and a plurality of lateral sides;
    a back cover comprising a horizontal portion supporting the rear side of the display panel and a vertical extension portion extending vertically from an end of the horizontal portion, so as to cover the lateral sides of the display panel; and
    an inner plate disposed between the display panel and the back cover and comprising a first horizontal portion having an inner surface attached to an inner surface of the horizontal portion of the back cover through an adhesive member, a downward-bending portion bent toward the back cover and extended from a periphery of the first horizontal portion of the inner plate, and a second horizontal portion extended from the downward-bending portion,
    wherein the second horizontal portion has an outer surface directly contacting the inner surface of the horizontal portion of the back cover without an additional adhesive member.

2. The display device of claim 1, wherein the back cover comprises an inward-bending portion arranged at an end of the vertical extension portion of the back cover so as to be bent toward at least one of the lateral sides of the display panel.

3. The display device of claim 2, further comprising a first gap for elastic deformation of the inward-bending portion provided between the vertical extension portion of the back cover and the inward-bending portion of the back cover.

4. The display device of claim 2, further comprising a second gap for elastic deformation of the downward-bending portion provided between the first and second horizontal portions of the inner plate and the downward-bending portion of the inner plate.

5. The display device of claim 1, wherein the downward-bending portion of the inner plate is configured to dissipate heat generated from the display panel through the back cover contacting the downward-bending portion of the inner plate.

6. The display device of claim 5, wherein the downward-bending portion of the inner plate has a double-folded structure comprising a primary folded portion that is primarily folded upward from the second horizontal portion of the inner plate and a secondary folded portion that is folded downward from an end of the primary folded portion.

7. The display device of claim 1, wherein the display panel includes an organic light-emitting display panel comprising a light-emitting layer comprising a substrate, multiple thin-film transistors on the substrate, and an organic light-emitting element layer emitting light between two electrode layers arranged on one side of the thin-film transistors, and an encapsulation layer arranged on one side of the light-emitting layer.

8. The display device of claim 7, wherein the organic light-emitting display panel includes a bottom-emission type such that light from the organic light-emitting element layer is discharged through the substrate.

9. The display device of claim 8, wherein, when a surface through which light from the organic light-emitting display panel is discharged is defined as an image display surface, the light-emitting layer and the encapsulation layer are successively laminated under the image display surface, the light-emitting layer has the substrate, the thin-film transistors, and the organic light-emitting element layer successively arranged under the image display surface, and a polarizing layer is arranged on the upper portion of the substrate.

10. The display device of claim 9, wherein the organic light-emitting element layer includes a white organic light-emitting element layer emitting white light, and the light-emitting layer comprises a color filter layer arranged on the white organic light-emitting element layer.

11. A display device, comprising:
a display panel having a rear side and a plurality of lateral sides;
a back cover comprising a first horizontal portion, a first vertical portion and a first bending portion,
wherein the first horizontal portion supports the rear side of the display panel and the first vertical extension portion is vertically extended from an end of the first horizontal portion to cover the lateral sides of the display panel, and the first bending portion is extended from the first vertical portion; and
an inner plate disposed between the display panel and the back cover and comprising a second horizontal portion, a third horizontal portion and a second bending portion,
wherein the second horizontal portion has an inner surface attached to an inner surface of the first horizontal portion and the second bending portion bent toward the back cover and extended from a periphery of the second horizontal portion, and the third horizontal portion extended from the second bending portion, and
wherein the third horizontal portion has an outer surface directly contacting the inner surface of the first horizontal portion without an additional adhesive member.

12. The display device of claim 11, further comprising a first gap for providing a first elastic deformation of the first bending portion located between the first vertical extension portion and the first bending portion.

13. The display device of claim 11, further comprising a second gap for providing a second elastic deformation of the second bending portion located between the second horizontal portion and the second bending portion.

14. The display device of claim 11, further comprising a first adhesive member disposed between the display panel and the back cover.

15. The display device of claim 11, wherein the first horizontal portion and the second horizontal portion are attached with each other through a second adhesive member.

16. The display device of claim 15, wherein the second adhesive member includes a double sided tape.

17. The display device of claim 11, wherein the second bending portion has a double-folded structure comprising a primary folded portion primarily folded upward from the second horizontal portion and a secondary folded portion folded downward from an end of the primary folded portion.

18. The display device of claim 11, wherein the first vertical portion has a length greater than that of the first bending portion.

19. The display device of claim 11, wherein the display panel includes an organic light-emitting display panel comprising a light-emitting layer comprising a substrate, multiple thin-film transistors formed on the substrate, and an organic light-emitting element layer emitting light between two electrode layers arranged on one side of the thin-film transistors, and an encapsulation layer arranged on one side of the light-emitting layer.

20. The display device of claim 19, wherein the organic light-emitting display panel includes a bottom-emission type such that light from the organic light-emitting element layer is discharged through the substrate.

* * * * *